United States Patent

Lindquist

Patent Number: 5,111,176
Date of Patent: May 5, 1992

[54] DUAL POSITION, FLAT MOUNT PIGGYBACK FUSE HOLDER

[75] Inventor: Carl E. Lindquist, Bridgewater, N.J.

[73] Assignee: San-O Industrial Corporation, Holbrook, N.Y.

[21] Appl. No.: 722,608

[22] Filed: Jun. 26, 1991

[51] Int. Cl.⁵ ...................... H01H 85/02; H01H 85/30
[52] U.S. Cl. .................................... 337/188; 337/265; 337/216; 361/405; 361/431; 439/622
[58] Field of Search ............... 337/186, 187, 188, 208, 337/209, 210, 216, 256, 265; 361/400, 403, 404, 405, 431, 432; 439/620, 621, 622, 62, 79, 80, 205, 206, 741, 743

[56] References Cited

U.S. PATENT DOCUMENTS 3,190,987 6/1965 Fister .................................. 337/265
3,538,480 11/1970 Urani .................................. 337/187

Primary Examiner—Harold Broome

[57] ABSTRACT

A dual position, piggyback fuse holder for mounting on the edge of a printed circuit board comprises two fuse holder compartments each adapted to receive a fuse assembly, plurality of coterminous contact pins which are locked in position and which can be inserted in corresponding apertures on the surface of the board and two locating bosses for anchoring the fuse holder on the board when the pins are inserted in said apertures and soldered.

4 Claims, 1 Drawing Sheet

DUAL POSITION, FLAT MOUNT PIGGYBACK FUSE HOLDER

FIELD OF THE INVENTION

This invention relates generally to fuse holders and is particularly related to dual position, flat mount piggyback fuse holders. More specifically, this invention relates to such fuse holders which, due to their unique piggyback construction, afford increased electric current density of the printed circuit board (PCB) with which the fuse holders are used.

BACKGROUND OF THE INVENTION

It is a common practice to protect printed circuit boards from damage caused due to overload current by installing or mounting a fuse assembly on the board. For safety reasons, the fuse assembly is usually installed in a fuse holder and the fuse holder is mounted on, or snapped onto the board.

In a copending application of the present inventor entitled "Single Position Flat Mount Fuse Holder", there is described a fuse holder for flat mounting on the edge of a printed circuit board. The fuse holder described in said application is a single position, i.e., holds one fuse assembly, and is designed to be mounted on the edge of the PCB in order to minimize the space requirement of the fuse holder—PCB assembly. Consequently, the fuse holder described therein is uniquely suitable for use in miniaturized electronic devices. One of the problems with that fuse holder, however, is the limitation on the number of fuse holders which can be mounted on a given surface of the PCB. This, in turn, limits the current density of the fuse holder—PCB assembly since the current density is limited by the number of fuse assemblies which are employed. In order to increase the current density per given surface area of the PCB, additional fuse assemblies must be utilized per given surface area of the PCB.

Accordingly, it is an object of this invention to provide a fuse holder which due to its unique construction affords increased current density of fuse holder—PCB assembly.

It is a further object of this invention to provide such a fuse holder which is of piggyback construction and dual position so as the accommodate two fuse assemblies per fuse holder.

It is also an object of this invention to provide a dual position piggyback fuse holder which can be securely and rigidly mounted on the edge surface of the PCB due to the unique design and construction of the fuse holder.

It is yet another object of this invention to provide a fuse holder having contact pins which are coterminous in order to facilitate insertion of the pins into corresponding apertures in the PCB surface.

The foregoing and other objects, features and advantages of the present fuse holders will be more clearly appreciated from the ensuing detailed description and the accompanying drawings.

SUMMARY OF THE INVENTION

In accordance with the present invention, a dual position, piggyback fuse holder is provided for flat mounting on the edge surface of a printed circuit board in order to satisfy the demand for minimum space requirements in electronic devices which accommodate fuse holder—PCB assemblies. Moreover, such fuse holders impart increased current density to the PCB.

The fuse holder of this invention comprises a fuse holder body portion having three opposed, spaced apart parallel walls; a front side wall, a rear side wall and an intermediate partition wall; a pair of opposed, spaced apart side edge walls, and a bottom closure wall, thus forming a front fuse holder compartment and a second fuse holder compartment separated by said partition wall. Each fuse holder compartment is adapted to receive a fuse assembly having a fuse element and spaced apart terminals. A pair of metallic generally U-shaped members are securely positioned in said front fuse holder compartment, with each of said members having an integral, laterally extending arm which protrudes though a rectangular aperture in the front side wall of the fuse holder body. Each protruded arm is twisted from about 45 to about 90 degrees to form a contact or lead pin which is locked in position. A metallic alarm contact plate is also secured in the front fuse holder compartment abutting the inside surface of one of said side edge walls. This plate protrudes through a rectangular aperture in the bottom closure wall, is twisted from about 45 to about 90 degrees at the exit of said aperture, and is bent approximately 90 degrees to form an alarm contact pin.

Another pair of metallic generally U-shaped members are secured in the rear fuse holder compartment. Each of these U-shaped members has an integral depending leg portion which protrudes through rectangular apertures in the bottom closure wall and is twisted at the aperture exit from about 45 to about 90 degrees and then bent approximately 90 degrees to form additional contact pins. A second metallic alarm contact plate is secured in said second fuse holder compartment and abuts the inside surface of the side edge wall. The second alarm contact plate protrudes through a rectangular aperture in the bottom closure wall and is twisted at said aperture exit from 45 to 90 degrees and bent approximately 90 degrees to form a second alarm contact pin.

In order to securely anchor the fuse holder body onto the surface of a PCB, a pair of spaced apart locating bosses are provided on the front side wall of the fuse holder body. Each of said bosses is located adjacent to the rectangular aperture in said front side wall and serve to anchor the fuse holder on the PCB surface as well as locate and align the fuse holders on the edge surface of the PCB.

BRIEF DESCRIPTION OF THE DRAWINGS

In the drawings, wherein like reference numerals are employed to designate like parts.

DETAILED DESCRIPTION OF THE INVENTION

Figure 1:
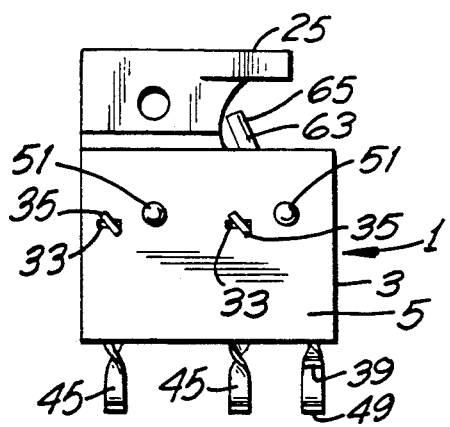
FIG. 1 is a front side elevational view of the fuse holder of the present invention with two fuse assemblies mounted therein.

Referring first to FIGS. 1-5 of the drawings, there are shown a fuse holder generally designated by the reference numeral 1 comprising a fuse holder body 3 usually fabricated (e.g., by molding) from a suitable plastic. Preferably the fuse holder body 3 is made of polyphenylene sulfide (PPS), available from Phillips Chemical Division of Phillips Petroleum Company under the trademark Ryton. This polymer is particularly suitable due to its desirable electrical insulative properties and high deflection temperature. Other plastics with similar properties may be used, if desired.

Figure 3:
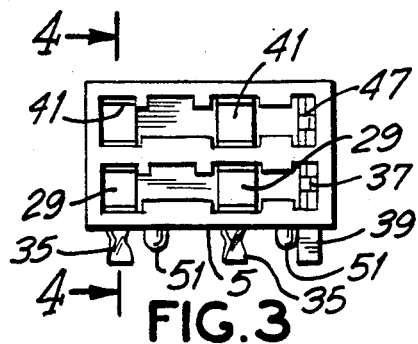
FIG. 3 is a top view of the fuse holder shown in FIG. 1.
Figure 4:
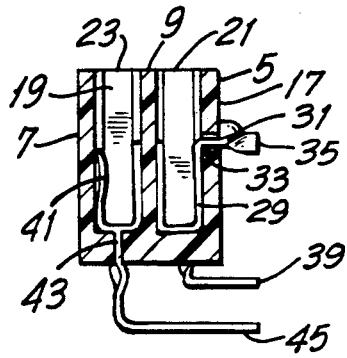
FIG. 4 is a view taken along the line 4—4 of FIG. 3.
Figure 5:
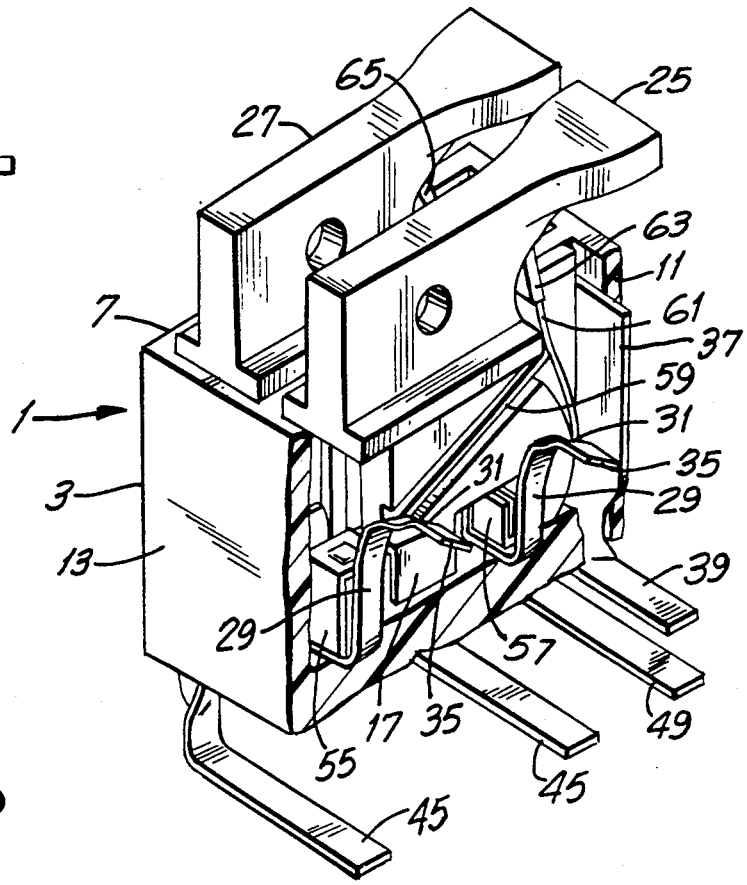
FIG. 5 is an elevational perspective view, partly in section, illustrating the dual position piggyback fuse holder of the present invention with two fuse assemblies mounted therein.

As is more clearly shown in FIGS. 3, 4 and 5, the fuse holder body 3 comprises three opposed, spaced-apart parallel walls or panels; a front side wall or panel 5, a rear side wall on panel 7 and an intermediate partition wall or panel 9; a pair of opposed, spaced-apart side edge walls or panels 11, 13 and a bottom closure wall or panel 15. The side edge walls or panels 11, 13 span across the respective sides of the fuse holder body 3 extending from the front side wall 5 to the rear side wall 7. The bottom closure wall 15 spans across the bottom of the fuse holder body 3, extending from one side edge wall to the other. Thus, the front side wall 5, the intermediate wall 9 and the rear side wall 7; the side edge walls 11, 13; and the bottom closure wall 15 define a front fuse holder compartment or cavity 17 and a rear fuse holder cavity or compartment 19, each cavity or compartment being open at the top of the fuse holder body as shown at 21, 23 separated by the intermediate wall or panel 9. The front fuse holder compartment 17 is adapted to receive a front fuse assembly 25 and the rear fuse holder compartment 19 is adapted to receive a rear fuse assembly 27 which is usually identical to the first fuse assembly 25. The fuse assemblies 25, 27 may be molded out of a plastic material similar to the plastic used for fabricating the fuse holder body 3, and each is sized and configured to fit snugly within its respective fuse holder compartment.

Within the front fuse holder compartment 17 there are securely fastened a pair of generally U-shaped metallic members 29, 29 each in the general from of a horseshoe clip. Each U-shaped member 29, 29 has an integral, horizontally extending arm 31, 31 which protrudes from the front side wall 5, e.g., through the rectangular slots 33, 33 in said wall and is twisted approximately 45 degrees to form the contact leads or pins 35, 35, which are locked in position due to twisting as aforesaid.

Also shown in the front fuse holder compartment 17 and securely fastened therein is a first metallic alarm contact plate 37 abutting the inside surface of the side edge wall 11. The first alarm contact plate 37 protrudes from the bottom closure wall 15 through a slot therein (not shown). After protruding from said bottom closure wall 15, said contact plate 37 is twisted approximately 45 degrees and bent approximately 90 degrees to form the alarm contact pin 39 which is locked in position due to twisting as aforesaid.

Within the rear fuse holder compartment 19, there are securely fastened a pair of generally U-shaped metallic members 41, 41, each in the general form of a horseshoe clip. Each of said U-shaped members 41, 41 has a depending leg portion 43, 43 which extends down and protrudes from apertures (not shown) in the bottom closure wall 15, whereat they are twisted approximately 45 degrees. After twisting, each leg portion extends down a finite distance, depending on the size of the fuse holder, and then bent approximately 90 degrees to form the contact pins 45, 45 which will be locked in position because of twisting of the legs 43, 43 (second depending leg not being visible and hence not shown) as aforesaid.

Located within the rear the fuse holder compartment 19 and securely fastened therein is a second metallic alarm contact plate 47 abutting the inside surface of the side edge wall 11. The second alarm contact plate 47 protrudes through an aperture (not shown) in the bottom closure wall 15, whereat it is twisted approximately 45 degrees. After extending downward a finite distance depending on the size of the fuse holder, the alarm contact plate 47 is bent approximately 90 degrees to form the alarm contact pin 49 which will be locked in position due to twisting as aforesaid.

It is important that the lead pins 35, 35 and 45, 45 be twisted in order to lock them in position. If not twisted, they tend to recoil into their respective fuse holder compartments 17, 19, when said pins are inserted into corresponding holes in the surface of the PCB, and soldered. Consequently, the fuse assemblies 25, 27 will not fit properly into their respective fuse holder compartments. The degree of twisting of said pins may usually vary from about 45 to about 90 degrees, the exact degree of twisting per se not being critical in this invention.

It is also preferable that all the contact pins be coterminous so as to insure rigid mounting of the fuse holder on the surface of the PCB.

Figure 2:
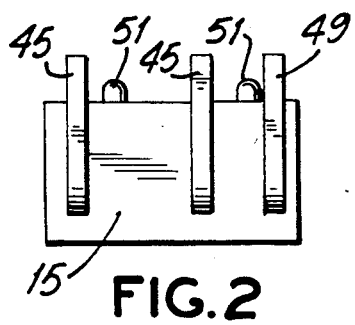
FIG. 2 is a bottom view of the fuse holder shown in FIG. 1.

In order to further enhance secure mounting of the fuse holder onto the surface of the PCB, the fuse holder body 3 is provided with a pair of spaced apart locating bosses 51, 51 on the front side wall 5 as shown in FIGS. 1, 2 and 4. The provision of the locating bosses 51, 51 is important since they are inserted, by pressure fitting, through corresponding located apertures in the surface of the PCB, in order to securely anchor the fuse holder body 3 in position while soldering the contact pins onto the PCB surface. Additionally, the bosses 51, 51 provide two locating points which serve to align the fuse holder body where several fuse holder bodies are mounted on a PCB such that they are lined upon along the edge of the PCB.

Figure 6:
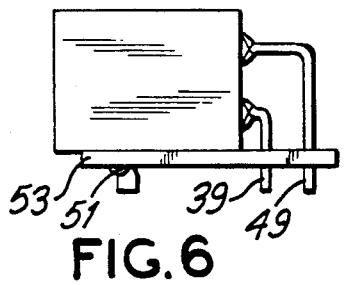
FIG. 6 is a front side elevational view of the fuse holder of the present invention mounted on the edge of a printed circuit board.

In use, the fuse holder 1 is mounted on the surface of PCB 53 as shown in FIG. 6. By pressure fitting the locating bosses 51, 51 into corresponding apertures (not shown) on the surface of the PCB, the fuse holder body 3 is securely anchored in place. The contact pins 35, 35, 39, 45, 45 and 49 are inserted in corresponding apertures (not shown) on the surface of the PCB and soldered in position. Either before or after mounting the fuse holder on the PCB, the fuse assemblies 25 and 27 are inserted into their corresponding fuse holder compartments 17 and 19. For the sake of simplicity in illustration, only the front fuse holder assembly is shown (see FIG. 5), the rear fuse holder assembly being identical thereto in construction and configuration. As seen from FIG. 5, the load contact terminal 55 and the battery contact terminal 57 engage the U-shaped members 29, 29 in the front fuse holder compartment 17. Similarly in the rear fuse holder compartment 19, similar contact terminal and battery load terminal (not shown) engage the U-shaped members 41, 41. When an overload current flows through the fuse, the fuse element 59 in the front fuse assembly 17 and a similar fuse element (not shown) in the rear fuse assembly melt and rupture thus releasing the alarm contact spring 61 in the front fuse assembly and a similar fuse element (not shown) in the rear fuse assembly thus releasing the alarm spring 61 which impacts on the contact plate 37, and a similar alarm spring (not shown) in the rear fuse assembly which impact on a similar alarm contact plate in the second fuse assembly, thus triggering the alarm through the contact pins 39 and 49 which are electrically connected to the alarm circuit through the PCB. A color coded bead 63 at the top of the alarm spring 61 indicates the current rating of the fuse in the front fuse assembly and is visible from the outside (top) of the fuse holder. A similar coded bead 65 (partially visible in FIG. 6) at the top of the alarm spring in the rear fuse assembly is also visible from the top of the fuse holder and indicates the current rating of the fuse in the rear fuse assembly.

Thus, as it can be seen from the foregoing description, the fuse holder of the present invention affords increased electric current density for the PCB due to its dual position and piggyback construction. It can be also appreciated that multiple position piggyback mounted fuse holder can be provided, if desired, when space limitation is not prohibitive and where further increase in current density is required.

Although the invention has been described and illustrated with a certain degree of particularly, several obvious changes and modifications are suggested from the description herein. Such changes and modifications are nevertheless within the scope of the present invention.

What is claimed is:

1. A dual position, piggyback fuse holder for flat mounting on an edge surface of a printed circuit board, said fuse holder comprising a fuse holder body portion made of an electrically insulative material and having three opposed, spaced apart parallel walls; a front side wall, a rear side wall and an intermediate partition wall; a pair of opposed spaced apart side edge walls extending from said front side wall to said rear side wall; and a bottom closure wall, said walls defining a first fuse holder compartment and a second fuse holder compartment, said first fuse holder compartment being adapted to receive a first fuse assembly having a fuse element and spaced contact terminals, and said second fuse holder compartment being adapted to receive a second fuse assembly having a fuse element and spaced contact terminals; a pair of generally U-shaped metallic members in said first fuse holder compartment, each of said generally U-shaped members having an integral, laterally extending arm portion which protrudes through a rectangular aperture in said front side wall and form a side contact pin which is twisted at said aperture from about 45 to about 90 degrees to lock said contact pin in position; a metallic alarm contact plate in said first fuse holder compartment abutting the inside surface of said edge wall and protruding through a rectangular aperture in said bottom closure wall forming an alarm contact pin which is twisted at said aperture from about 45 to about 90 degrees to lock said alarm contact pin in position; a pair of generally U-shaped members in said rear fuse holder compartment, each U-shaped member having an integral depending leg portion which protrudes through apertures in said bottom wall and twisted thereat from about 45 to 90 degrees and bent approximately 90 degrees to form additional contact pins, and a second alarm contact plate member abutting the inside surface of the edge wall in said second fuse holder compartment, said second alarm contact plate protruding from an aperture in said bottom closure wall, twisted thereat from about 45 to about 90 degrees and bent approximately 90 degrees to form a second alarm contact pin.

2. A fuse holder as in claim 1 wherein said front side wall of said fuse holder body is provided with a pair of spaced apart bosses adapted for pressure fitting into corresponding apertures on the surface of a printed circuit board for locating and anchoring said fuse holder body on said printed board circuit.

3. A fuse holder as in claim 1 wherein all contact pins are coterminous.

4. A fuse holder as in claim 2 wherein all contact pins are coterminous.

* * * * *